(12) United States Patent
Wu et al.

(10) Patent No.: US 9,379,045 B2
(45) Date of Patent: Jun. 28, 2016

(54) COMMON DRAIN POWER CLIP FOR BATTERY PACK PROTECTION MOSFET

(71) Applicant: Fairchild Semiconductor Corporation, San Jose, CA (US)

(72) Inventors: Chung-Lin Wu, San Jose, CA (US); Steven Sapp, Santa Cruz, CA (US); Bigildis Dosdos, San Jose, CA (US); Suresh Belani, Los Altos, CA (US); Sunggeun Yoon, Cupertino, CA (US)

(73) Assignee: Fairchild Semiconductor Corporation, San Jose, CA (US)

( * ) Notice: Subject to any disclaimer, the term of this patent is extended or adjusted under 35 U.S.C. 154(b) by 71 days.

(21) Appl. No.: 14/026,181

(22) Filed: Sep. 13, 2013

(65) Prior Publication Data
US 2014/0070392 A1 Mar. 13, 2014

Related U.S. Application Data

(60) Provisional application No. 61/794,857, filed on Mar. 15, 2013, provisional application No. 61/700,738, filed on Sep. 13, 2012.

(51) Int. Cl.
| | |
|---|---|
| *H01L 23/495* | (2006.01) |
| *H01L 21/56* | (2006.01) |
| *H01L 23/433* | (2006.01) |
| *H01L 23/00* | (2006.01) |
| *H01L 23/31* | (2006.01) |

(52) U.S. Cl.
CPC ............ *H01L 23/495* (2013.01); *H01L 21/563* (2013.01); *H01L 23/4334* (2013.01); *H01L 23/49524* (2013.01); *H01L 23/49548* (2013.01); *H01L 23/49562* (2013.01); *H01L 24/36* (2013.01); *H01L 24/40* (2013.01); *H01L 23/3121* (2013.01); *H01L 2224/40245* (2013.01); *H01L 2924/1306* (2013.01); *H01L 2924/13091* (2013.01); *H01L 2924/181* (2013.01)

(58) Field of Classification Search
CPC .............................. H01L 29/781; H01L 24/16
See application file for complete search history.

(56) References Cited

U.S. PATENT DOCUMENTS

| | | | |
|---|---|---|---|
| 2002/0000568 A1 | 1/2002 | Ohshima | |
| 2007/0132073 A1* | 6/2007 | Tiong et al. | 257/666 |
| 2009/0179265 A1* | 7/2009 | Harnden et al. | 257/341 |

FOREIGN PATENT DOCUMENTS

| | | |
|---|---|---|
| CN | 101557100 A | 10/2009 |
| CN | 203589028 U | 5/2014 |
| JP | 8-32060 A | 2/1996 |

OTHER PUBLICATIONS

First Office Action, mailed Sep. 6, 2015, issued in corresponding Chinese Application No. 201310418130.2, filed Sep. 13, 2013, 10 pages

*Primary Examiner* — Matthew W Such
*Assistant Examiner* — Krista Soderholm (57) ABSTRACT

A first embodiment is a common drain+clip 20. It has a conventional drain contact on its bottom surface and is flip chip mounted on a half-etched leadframe 40 which has external source, gate and drain contacts connected to the sources, gate and common drain of the die 20. Common drain clip 50 connects the drain 30 to external contacts between opposite gate contacts. A second embodiment is a direct drain embodiment+heatslug. The device 80 has a top drain contact 36 that extends to the common drain 30 across the bottom of the die which is flip chip mounted to a half-etched leadframe having external source, gate and drain contacts connected to the sources, gates and common drain of the die 80.

24 Claims, 5 Drawing Sheets

COMMON DRAIN POWER CLIP FOR BATTERY PACK PROTECTION MOSFET

CROSS-REFERENCES TO RELATED APPLICATIONS

This application claims the benefit of Provisional Application No. 61/794,857, filed Mar. 15, 2013, and further claims the benefit of Provisional Application No. 61/700,738, filed Sep. 13, 2012, the entire disclosures of which are hereby expressly incorporated by reference in their entirety.

BACKGROUND

Various protection mechanisms for lithium ion batteries exist. If a lithium ion battery overcharges, strong exothermic reactions are possible and the potential for causing a fire increases. To prevent a lithium ion battery from overcharging, a battery protection circuit is used. The battery protection circuit often contains, among other components, two FET (field effect transistor) switches and a control integrated circuit. One FET prevents current from flowing into the battery, while the other prevents current from flowing from the battery unless the control IC enables it.

Figure 1:
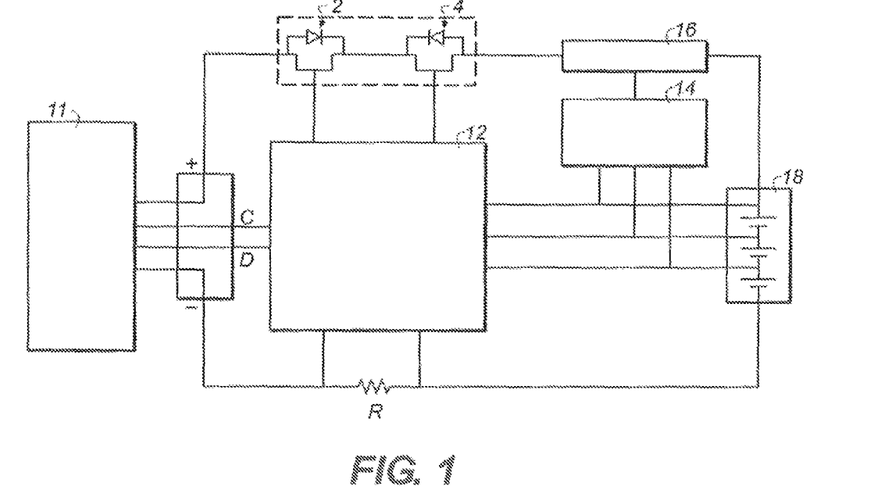
FIG. 1 is a schematic of a battery power management circuit.

Battery protection circuits often protect cell phones, smart phones, and computer tablets. In such electronic devices, space for components on a circuit board must be kept to a minimum. Accordingly, not only are the device components themselves kept to a minimum size, but the packaged device(s) must also be kept to a minimum. A typical battery management circuit 10 is shown in FIG. 1. A system 11, such as a cell phone, personal computer, etc., has a battery 18 for operating the system 11. A power management circuit 12 regulates the operation of two power mosfets 2, 4 which will charge and discharge the battery 18. A secondary protection circuit 14 is disposed between a fuse 16 and lines connecting the battery 18 to the power management circuit 12. The power management circuit prevents the battery from overcharging and from excessive discharging which would prevent future recharging of the battery.

The individual mosfets 2, 4 have been separately packaged and wired together as shown in FIG. 1. However, as systems are made smaller, there is a need for reducing the net area occupied by the mosfets and a corresponding requirement that devices operating in the reduced areas perform as well or better than devices with larger areas. These requirements present challenges to those skilled in the art because reducing the size of a mosfet generally increases the resistance of the series connected mosfets, or RSS (resistance source-to-source).

Embodiments of the invention are not limited to such uses as structures as shown herein and other uses and embodiments of the invention may be contemplated. For example, exemplary embodiments may be mounted to circuit boards along with other components in electrical systems such as computer systems, servers, wireless phones, televisions, power supplies, etc. Embodiments of the invention are robust and stable. Aspects of the semiconductor die package provide greater packaging efficiencies than previously encountered, as well as excellent thermal performance due to the exposed IC die attach pad and clip structures. This allows for smaller space requirements, cost savings and easier manufacturing procedures for applications such as LCD electronics. Furthermore, in exemplary embodiments, the placement of a half bridge circuit on each of opposite surfaces of the leadframe creates more stable and rigid circuitry. In such placement, the clip structures can be exposed by the molding material on both the back and front sides of the package, allowing for good thermal performance.

As used herein "top" and "bottom" surfaces are used in the context of relativity with respect to a circuit board upon which the semiconductor die packages according to embodiments of the invention are mounted. Such positional terms may or may not refer to absolute positions of such packages.

The semiconductor die packages described above can be used in electrical assemblies including circuit boards with the packages mounted thereon. They may also be used in systems such as phones, computers, etc.

Any recitation of "a", "an", and "the" is intended to mean one or more unless specifically indicated to the contrary. The terms and expressions which have been employed herein are used as terms of description and not of limitation, and there is no intention in the use of such terms and expressions of excluding equivalents of the features shown and described, it being recognized that various modifications are possible within the scope of the invention claimed.

Moreover, one or more features of one or more embodiments of the invention may be combined with one or more features of other embodiments of the invention without departing from the scope of the invention.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

The invention provides a single die with two electrically separated mosfets on the same substrate. One embodiment is a conventional vertical mosfet with a drain clip and the other embodiment is a vertical mosfet with a direct drain contact and a heatslug. Each embodiment requires less space than occupied by two separately packaged mosfets. Each embodiment provides a larger die than either of the separated mosfets. As such, the combined source-to-source resistance for both embodiments is lower than two separated mosfets.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

The embodiments of this invention provide a packaged semiconductor device that is a single die which includes two non-singulated N-channel mosfets. The single die has a common drain for both mosfets. The single die mounts in flip chip fashion on a base leadframe. The non-singulated mosfets on the single die permit drain connections that maximize die area with a smaller package outline. The common drain design of the embodiments with a drain clip and with a direct drain and heatslug improve RSS (resistance source-to-source) between the two mosfets and improves their thermal performance.

The embodiments of the invention provide solutions to one or more problems of prior art packages. Both embodiments have two separate mosfets on a single die. Both mosfets are vertical mosfets with heavily doped drain layer on one surface and source and gate regions on other surface of the die. Both embodiments have better thermal performance than prior art embodiments with singulated devices.

A first embodiment of the invention is a common drain+ clip embodiment. It has a conventional drain contact on its bottom surface and uses a drain clip for routing the connection from the drain on the lower surface of the substrate to the top of the die and between opposite gate contacts. The common drain+clip embodiment improves the potential battery life of the small system by providing low source-to-source electrical resistance (RSS). The cost of the small system is also reduced by allowing flip chip mounting of a non-singulated die which permits a package with common drain leads for easy connection between mosfet and between the mosfets and their control IC.

A second embodiment of the invention is a direct drain embodiment+heatslug. The second embodiment provides a drain contact on the top side of the die which also has gate and source contacts. The drain contact is coupled to a common, heavily doped drain layer on the other side of the die by a deep, heavily doped diffusion.

Figure 2A:
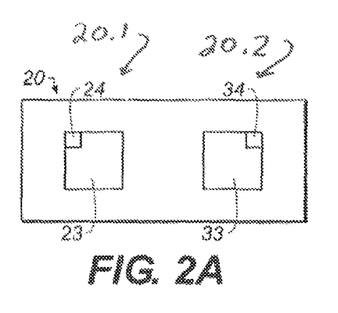
FIGS. 2A and 2B are plan and section views, respectively, of a dual mosfet die with a common bottom drain.
Figure 2B:
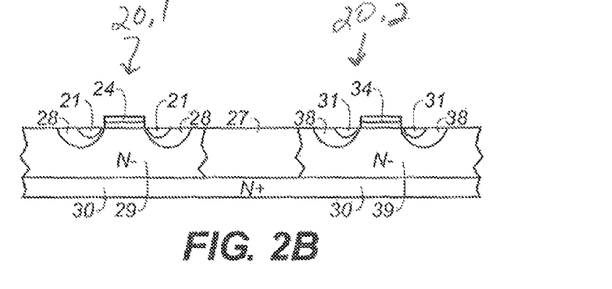

Turning to FIGS. 2A and 2B, a common drain dual mosfet die 20 has mosfets 20.1, 20.2 with source contact areas 23, 33 and gate contact areas 24, 34 associated with the respective mosfets. The mosfets are separated from each other on the die by a region 27 of intrinsic or very lightly doped silicon. This region is relatively wide and corresponds to the typical space between adjacent mosfets on a semiconductor wafer. The region between mosfets is generally masked from surface diffusions and may be intrinsic silicon with little or no dopants. Such region 27 is commonly referred to as a street and a dicing blade normally slices through the streets to separate the dies. However, in the case of the dual mosfet die 20, the two mosfets 20.1, 20.2 are not separated. Regions 29, 39 are typically lightly doped drift regions of dopants of the same type as the source and drain. A common drain layer 30 is on the bottom surface of the dual mosfet die 20. Those skilled in the art understand that each mosfet 20.1, 20.2 comprises an array of cells with surface source regions separated from each other by insulated gates. The sources 21, 31, are commonly connected to the source contact areas 23, 33 and the gate regions are commonly connected to the gate contact areas 24, 34.

Turning to FIG. 2B, the bottom of the die 20 is heavily doped to form the common drain layer 30 that acts as the drain for both devices 21, 31. On the top surface insulated gates 24, 34 separate source regions 21.1, 21.2 and 31.1, 31.2 from each other. The sources are heavily doped with the same type dopant as the common drain and are formed in oppositely doped body regions 28.1, 28.2 and 38.1, 38.2, respectively. When one of the transistors is on, carriers travel vertically from the sources, under the gates, through the drift regions to the common drain.

Figure 3A:
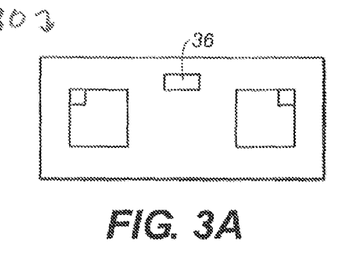
FIGS. 3A and 3B are plan and section views, respectively, of a dual mosfet die with a direct drain.
Figure 3B:
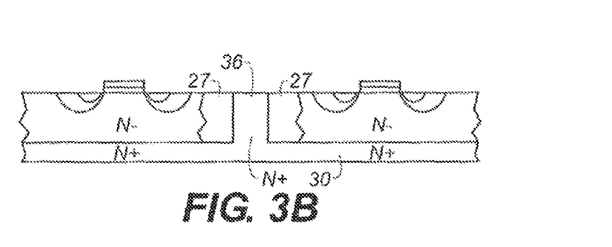

FIGS. 3A and 3B show the direct drain dual mosfet device 80 of the second embodiment of the invention. The difference between the direct drain embodiment 80 and the first embodiment 20 is a deep diffusion 36 that extends from a drain contact area on the top surface of the substrate, through the intrinsic or lightly doped region 27 to contact the common drain 30. The diffusion 36 is heavily doped with the same type dopants as the source and the drain. As such, the embodiment of FIGS. 3A, 3B has source, gate and drain contacts on the top surface of the device and the two mosfets are separated by an undoped or very lightly doped region 27 which include the deep drain diffusion 36.

Figure 4:
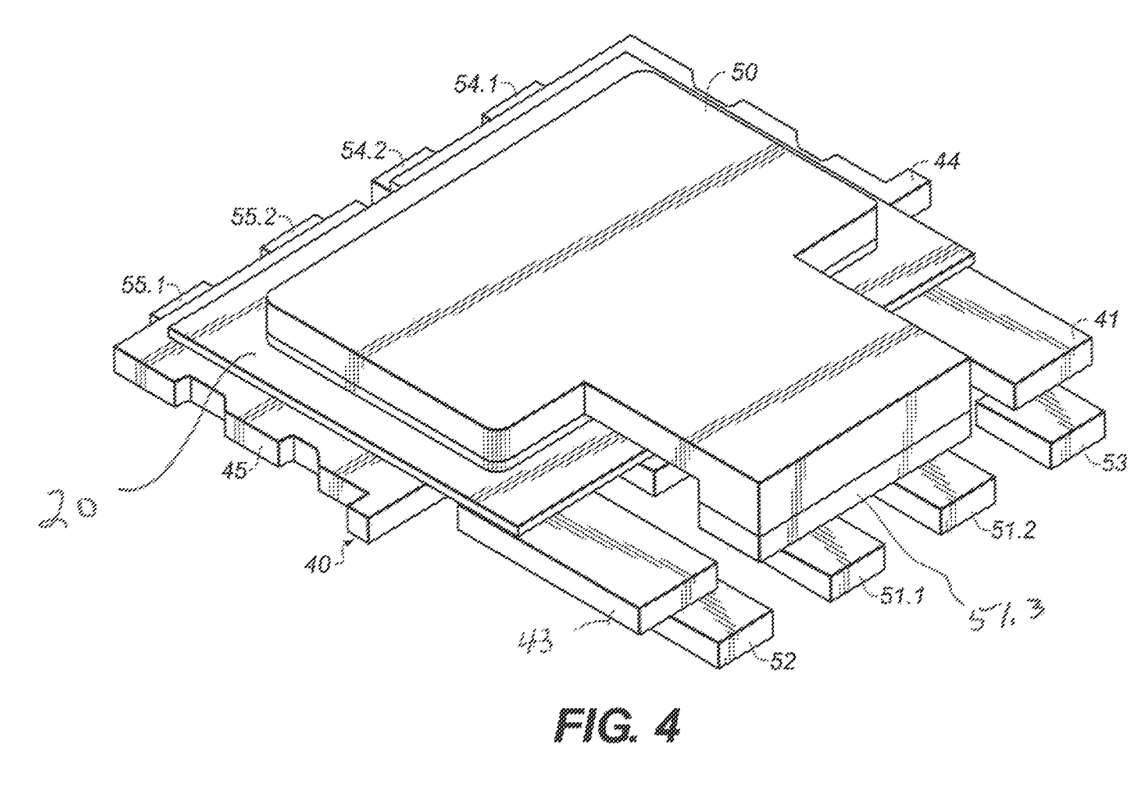
FIG. 4 is a perspective view of a first embodiment.
Figures 5A, 5B:
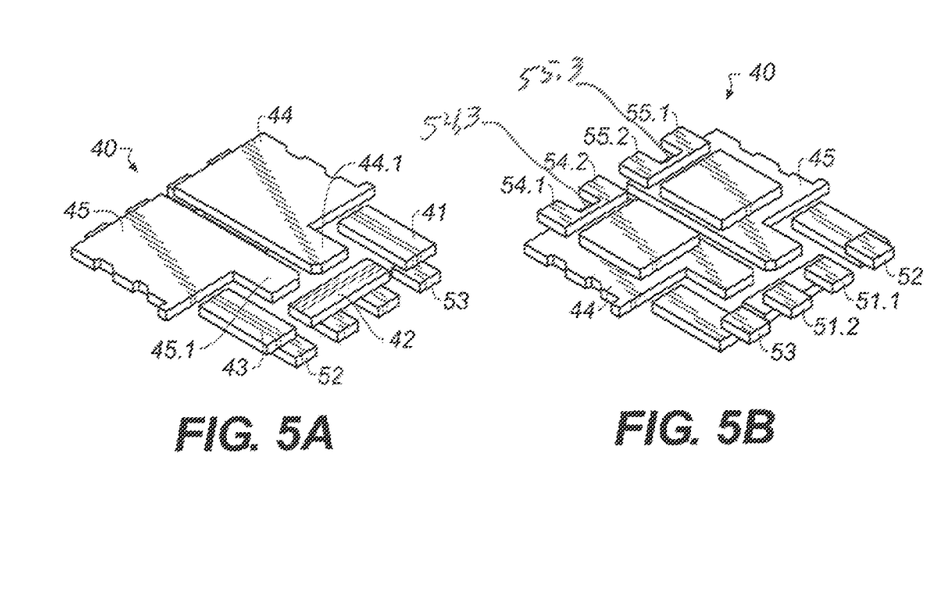
FIGS. 5A, 5B, 5C are perspective views of the assembly of the first embodiment of the invention.

FIG. 4 shows an example of the first embodiment that comprises a common drain dual mosfet 20 mounted on a half-etched leadframe 40 and covered by a drain clip 50. The leadframe 40 has a top portion with an internal drain bar 42 disposed between opposite gate bars 41,43 and two source pads 44,45, each with an elongated finger portion 44.1,45.1, respectively. The bottom of the leadframe is shown in FIG. 5B and it has four external source leads in two pairs, 54.1, 54.2 and 55.1, 55.2 that are coupled together by connecting portions 54.3, 55.3, respectively. Two external drain leads 51.1, 51.2 are connected by cross member 42 and external gate leads 52, 53 are on opposite sides of the drain leads 51.1 and 52.2.

Figure 5C:
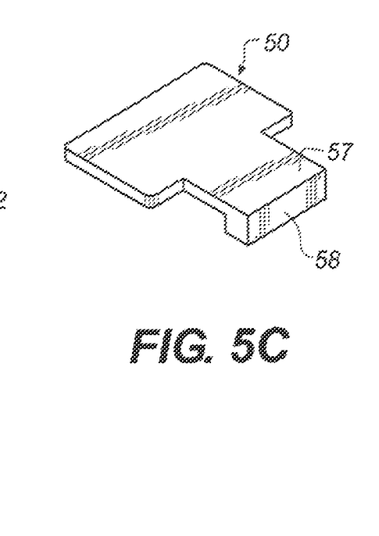
Figure 6:
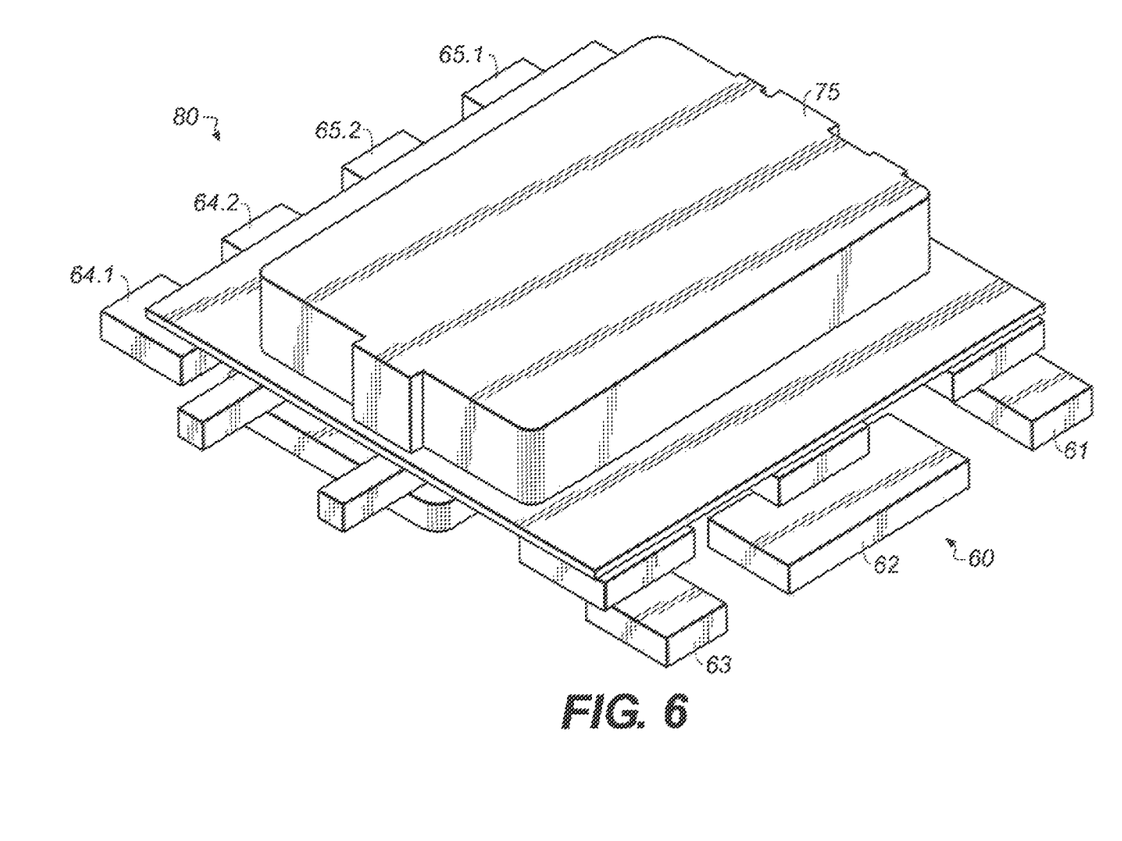
FIG. 6 is a perspective view of a second embodiment.

The assembly of the first embodiment is shown in FIGS. 5A, 5B, 5C. The leadframe 40 is half etched to provide the upper and lower portions as shown in FIGS. 5A, 5B, respectively. The common drain die is flip chip mounted with its source and gate areas contacting and fixed to the source pads 44, 45 and the ends of the gate leads 41, 43 proximate the gate leads. The clip 50 is fixed to the common drain 30 on the bottom of the die. A finger 57 extends from the body of the clip and terminates with a downward projection 58. The projection 58 is fixed to the drain bar 42 of the leadframe 40.

The clip, device and leadframe are molded in an insulating resin. The source pad external contacts help cool the device from the bottom of the package. If further or dual cooling is desired, one may remove some or all of the insulating resin from above the clip.

Figure 7A:
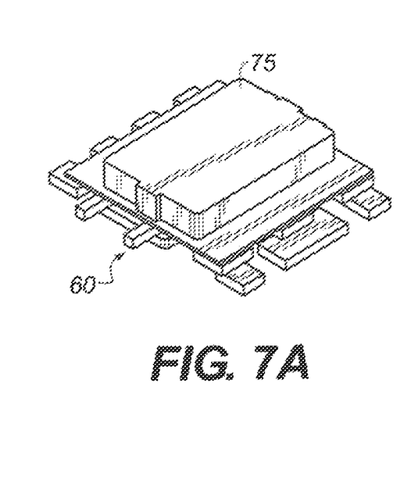
FIGS. 7A, 7B, 7C are perspective views, respectively, of the assembly of the second embodiment of the invention.
Figure 7B:
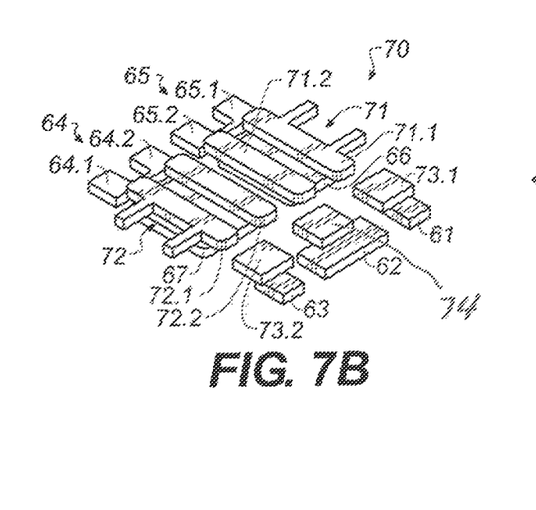
Figure 7C:
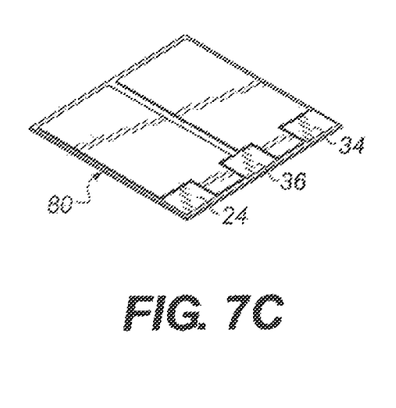

FIGS. 6, 7A, 7B, and 8B shows an example of the second embodiment of the invention, a dual channel direct connected mosfet with a heat slug. FIGS. 7A, 7B, 7C show the stages of assembly of the heatslug embodiment. The direct connected dual channel mosfet 80 is flip chip mounted onto leadframe 60 and thereafter heatslug 75 is affixed to the exposed lower surface of mosfet 80. An N-channel mosfet 80 is flip chip mounted on a leadframe 60 that is half-etched to divide the leadframe into upper and lower portions. The lower portion includes source attach pads 66, 67 that attach to the areas on a printed circuit board. There are two pairs of external source contacts 64, 65, with the first pair 64 having two external contact leads 64.1, 64.2 and second pair 65 including external contacts 65.1, 65.2. On the opposite side of the lower leadframe are gate contacts 61, 63 at opposite ends of the edge of the lower leadframe and an external direct drain contact 62 disposed between the external gate contacts. The upper leadframe 70 has first and second pairs of contact bars 71, 72 comprising elongated bars 71.1 and 71.2 for one pair and elongated bars 72.1, 72.2 for the other pair. Each pair of source contact bars is integral with external source pads 66, 67. The device 80 is flip chip connected to the source bars 71, 72. The upper leadframe also has upper gate contact pads 73.1, 73.2 and a direct drain contact pad 74 disposed between the two gate contact pads. Drain contact pad 74 is directly connected to drain diffusion and gate contact pads 73.1, 73.2 are directly connected to the gates 34, 35.

A heatslug 75 is mounted directly on the common drain 30 of the dual mosfet 80. Heatslug 75 may comprise a thermally and (optionally) electrically conductive material such as copper, aluminum, or alloys thereof. It may have a major surface that is shaped as a square. The thermally conductive material coupling the heatslug to the surface of the die may comprise any suitable material including a thermally conductive epoxy or solder (Pb-based or lead free).

The heatslug, device and leadframe are molded in an insulating resin. The source pad external contact helps cool the device from the bottom of the package. If further or dual cooling is desired, one may remove some or all of the insulating resin from above the heatslug.

The embodiments of the invention take up less area on a printed circuit board for a small system, such as a cell phone, where space is very limited. In addition, the embodiments achieve the same or better resistance source-to-source (RSS) performance than prior art systems that use two separate mosfets. The direct drain+heatslug takes less space than the common drain+clip. For example, one may achieve the same performance as a common drain+clip which has a package with outside dimensions of 3.3×3.3 mm (10.89 mm$^2$) with a direct drain+heatslug dual channel direct drain device which has a comparable area of 3.0×3.0 mm (9.0 mm$^2$). Compared to the dual mosfet and clip device, the dual channel direct drain device takes up 21% less space and increases die area 4% which reduces RSS. The maximum allowable die size is limited by the space requirement (0.15 mm for the 8 mils leadframe) between source paddle to the outer lead.

Table 1 compares the embodiment with a common drain and power clip, an embodiment with direct connected dies and without a heat slug, and the embodiment with direct connected dies and a heatslug. The direct drain device without a heatslug has the highest RSS. However, adding a heatslug reduces RSS to less than the RSS of the common drain+drain clip embodiment. Other test results show that improvements in RSS for the common drain and power clip embodiment are a function of die area. As the die area increases, RSS decreases. A small increase in area can provide a dramatic reduction in RSS.

TABLE 1

| Device | RSS @ 10 V | | RSS @ 4.5 V | |
|---|---|---|---|---|
| | TYP (mΩ) | Max* (mΩ) | TYP (mΩ) | Max** (mΩ) |
| Common Drain + clip | 3.51 (100.0%) | 4.21 | 4.99 | 6.23 |
| Direct Drain w/o heatslug | 5.65 (161.3%) | 6.79 | 7.13 | 8.91 |
| Direct Drain + heatslug | 3.24 (92.4%) | 3.89 | 4.64 | 5.81 |

The embodiments are encapsulated in a molding compound in a manner well known to those skilled in the art. The leadframes are formed from sheet or metal, metal alloys and layers of metal well known to those skilled in the art. Those skilled in the art also understand that the devices shown and described in this patent may be molded in insulating resin or placed in ceramic packages.

The term "leadframe structure" can refer to a structure that is derived from or is the same as a leadframe. Each leadframe structure can include two or more leads with lead surfaces and a die attach region. The leads extend laterally from the die attach region. A single leadframe structure may include a gate lead structure and a source lead structure.

The leadframe structure may comprise any suitable material. Exemplary leadframe structure materials include metals such as copper, aluminum, gold, etc., and alloys thereof. The leadframe structures may also include plated layers such as plated layers of gold, chromium, silver, palladium, nickel, etc. The leadframe structure may also have any suitable thickness, including a thickness less than about 1 mm (e.g., less than about 0.5 mm).

The leadframe structure can be stamped, etched and/or patterned using conventional processes to shape the leads or other portions of the leadframe structure. For example, the leadframe structure can be formed by stamping, or by etching a continuous conductive sheet to form a predetermined pattern. If by etching, before or after etching the leadframe structure can also be optionally stamped so that a die attach surface of the leadframe structure is downset with respect to the lead surfaces of the leads of the leadframe structure. If stamping is used, the leadframe structure may be one of many leadframe structures in an array of leadframe structures that are connected by tie-bars. The leadframe structure array may also be cut to separate the leadframe structures from other leadframe structures. As a result of cutting, portions of a leadframe structure in a final semiconductor die package such as a source lead and a gate lead may be electrically and mechanically uncoupled from each other. Thus, a leadframe structure may be a continuous metallic structure or a discontinuous metallic structure.

While illustrative embodiments have been illustrated and described, it will be appreciated that various changes can be made therein without departing from the spirit and scope of the invention.

The embodiments of the invention in which an exclusive property or privilege is claimed are defined as follows:

1. A packaged semiconductor device comprising:
    a leadframe with source, gate, and drain leads extending to external source, gate, and drain terminals, wherein the external source terminals are on one edge of the packaged semiconductor device and the external common drain and gate terminals are on the opposite edge of the packaged semiconductor device;
    a single semiconductor substrate having upper and lower surfaces and first and second vertical mosfets, each vertical mosfet having source and gate contact areas on the upper surface of the substrate, said respective source and gate contact areas isolated from each other by the substrate and the substrate having a common drain on the lower surface of the substrate and connected to both vertical mosfets;
    means for connecting the source, gate and drain external terminals of the leadframe to the respective sources, gates and common drain contact areas of the substrate;
    a metal member coupled to the substrate and on a surface of the substrate opposite to the leadframe; and
    a molding compound embedding the leadframe, the substrate and the metal member in insulating resin and exposing external terminals of the leadframe connected to the sources, gate and the direct drain area of substrate.

2. The packaged semiconductor device of claim 1 wherein a portion of the molding compound is removed to expose a corresponding portion of the metal member.

3. The packaged semiconductor of claim 1 wherein the metal member is a heatslug and the common drain on the bottom of the substrate is connected to a drain contact on the upper surface of the substrate by a highly doped diffusion.

4. The packaged semiconductor device of claim 1 wherein the metal member is a clip and the substrate is flip chip mounted on the leadframe and the clip connects the common drain to one or more external drain leads.

5. The packaged semiconductor device of claim 1 wherein the means for connecting the source external terminals of the leadframe to the respective source contact areas of the vertical mosfets comprises:

source pads, each source pad connected to the source contact area of one of the vertical mosfets and to an external source terminal of the packaged device,
wherein each source pad has a central region connected to a source contact area of one of the vertical mosfets, the central region directly connected to an external source terminal.

6. The packaged semiconductor device of claim 5 wherein the means for connecting the gate external terminals of the leadframe to the respective gate contact areas of the vertical mosfets comprises gate bars, each gate bar connected between a gate contact area of one of the vertical mosfets and an external gate terminal.

7. The packaged semiconductor device of claim 5 wherein the means for connecting the external common drain terminals of the leadframe to the respective common drain contact areas of the vertical mosfets comprises drain bars, each drain bar connected between a common drain contact area of one of the vertical mosfets and an external common drain terminal.

8. The packaged semiconductor device of claim 1 wherein the means for connecting the source external terminals of the leadframe to the respective source contact areas of the vertical mosfets comprises source pads and source bars,
wherein each source pad is connected to an external source terminal of the packaged device and each source pad has a central region, and
wherein each source bar is connected to the central region of a source pad and to a source contact area of one of the vertical mosfets.

9. A packaged semiconductor device comprising:
a leadframe with source, gate, and drain leads extending to external source, gate, and drain terminals, wherein the external source terminals are on one edge of the packaged semiconductor device and the external common drain and gate terminals are on the opposite edge of the packaged semiconductor device;
a single semiconductor substrate having an upper and lower surface, first and second mosfets in the substrate, each mosfet having source and gate contact areas on the upper surface of the substrate, said source and gate contact areas isolated from each other by the substrate;
a diffusion extending from the surface of each mosfet to the common drain for providing a contact on the upper surface of the substrate to the common drain on the bottom surface of the substrate;
a heatslug affixed to the lower surface of the semiconductor substrate; and
a molding compound embedding the leadframe, the substrate and the heatslug in insulating resin and exposing external terminals of the leadframe connected to the sources, gate and the direct drain area of substrate.

10. The packaged semiconductor device of claim 9 wherein a portion of the molding compound is removed to expose a corresponding portion of the heatslug.

11. The packaged semiconductor device of claim 10 wherein the leadframe has a drain pad on its upper surface for contacting the drain area on the upper surface of the substrate.

12. The packaged semiconductor device of claim 9 wherein the leadframe has external leads on a lower portion and internal leads on an upper portion.

13. The packaged semiconductor device of claim 9 wherein the substrate is flip chip mounted on the leadframe.

14. A packaged multiple substrate semiconductor device comprising:
a leadframe with source, gate, and drain leads extending to external source, gate, and drain terminals, wherein the external source terminals are on one edge of the packaged semiconductor device and the external common drain and gate terminals are on the opposite edge of the packaged semiconductor device;
a single semiconductor substrate having an upper and lower surface, first and second mosfets, each mosfet having source and gate contact areas on the upper surface of the substrate, said source and gate contact areas isolated from each other by the substrate;
a drain clip affixed to the common drain of the substrate and having one or more leads extending to the drain leads of the leadframe; and
a molding compound embedding the leadframe, the substrate and the clip in insulating resin and exposing external terminals of the leadframe connected to the sources, gate and the drain clip.

15. The packaged semiconductor device of claim 14 wherein a portion of the molding compound is removed to expose a corresponding portion of the clip.

16. The packaged semiconductor device of claim 14 wherein the leadframe has external leads on a lower portion and internal leads on an upper portion.

17. The packaged semiconductor device of claim 16 wherein the leadframe has a drain pad on its upper surface for contacting the clip.

18. The packaged semiconductor device of claim 16 wherein the means for connecting the gate external terminals of the leadframe to the respective gate contact areas of the vertical mosfets comprises gate pads, each gate pad connected between a gate contact area of one of the vertical mosfets and an external gate terminal.

19. The packaged semiconductor device of claim 16 wherein the means for connecting the common drain terminals of the leadframe to the respective common drain contact areas of the vertical mosfets comprises common drain pads, each common drain pad connected between a common drain contact area of one of the vertical mosfets and an external common drain terminal.

20. The packaged semiconductor device of claim 14 wherein the substrate is flip chip mounted on the leadframe.

21. A method for packaging a semiconductor device comprising:
providing a leadframe with source, gate, and drain leads extending to external source, gate, and drain terminals, wherein the external source terminals are on one side of the packaged semiconductor device and the external common drain and gate terminals are on the opposite side of the packaged semiconductor device;
providing a single semiconductor substrate having upper and lower surfaces, first and second mosfets, each mosfet having source and gate contact areas on the upper surface of the substrate, said source and gate contact areas isolated from each other by the substrate and the substrate having a common drain on the bottom of the substrate;
connecting the source, gate and drain external terminals of the leadframe to the sources, gates and common drain of the substrate;
connecting a metal member to the substrate and on a surface of the substrate opposite to the leadframe; and
molding the leadframe, the substrate and the metal member in insulating resin and exposing external terminals of the leadframe connected to the sources, gate and the direct drain area of substrate.

22. The method of claim 21 wherein a portion of the molding is removed to expose a corresponding portion of the metal member.

23. The method of claim 21 the metal member is a heatslug and the common drain on the bottom of the substrate is connected to a drain contact on the upper of the substrate by a highly doped diffusion.

24. The method of claim 21 wherein the metal member is a clip and the substrate is flip chip mounted on the leadframe and the clip connects the common drain to one or more external drain leads.

\* \* \* \* \*